United States Patent
Bourianoff et al.

(10) Patent No.: US 7,121,474 B2
(45) Date of Patent: Oct. 17, 2006

(54) ELECTRO-OPTICAL NANOCRYSTAL MEMORY DEVICE

(75) Inventors: George I. Bourianoff, Austin, TX (US); Robert Lindstedt, Portland, OR (US); Harry A. Atwater, South Pasadena, CA (US); Maria Giorgi, Sherwood, OR (US); Robert J. Walters, Pasadena, CA (US); Julie D. Casperson, Santa Monica, CA (US); Pieter G. Kik, Pasadena, CA (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 10/465,354

(22) Filed: Jun. 18, 2003

(65) Prior Publication Data

US 2003/0230629 A1    Dec. 18, 2003

Related U.S. Application Data

(60) Provisional application No. 60/389,589, filed on Jun. 18, 2002.

(51) Int. Cl.
G06K 19/06    (2006.01)
(52) U.S. Cl. .................................................. 235/494
(58) Field of Classification Search ............... 235/454, 235/435, 446–447; 257/314, 315, 321, 326
See application file for complete search history.

(56) References Cited

U.S. PATENT DOCUMENTS 5,323,019 A    6/1994 Dutta et al.

(Continued)

OTHER PUBLICATIONS

Miller, D. A. B. et al., "Field-Effect Transistor Self-Electrooptic Effect Device: Integrated Photodiode, Quantum Well Modulator and Transistor," *IEEE Photonics Technology Letters*, vol. 1, No. 3, (Mar. 1989), pp. 62-64.
Partovi, A. et al., "Electroabsorption in II-VI Multiple Quantum Wells," *Appl. Phys. Lett.*, vol. 58, No. 4, (Jan. 28, 1991), pp. 334-336.

(Continued)

*Primary Examiner*—Steven S. Paik
*Assistant Examiner*—Edwyn Labaze
(74) *Attorney, Agent, or Firm*—Blakely, Sokoloff, Taylor & Zafman LLP

(57) ABSTRACT

A memory device. The memory device includes a substrate and an array of nanocrystals formed proximate to the substrate. The array of nanocrystals is electrically insulated to hold charge carriers therein. A presence of charge carriers within the array of nanocrystals represents a first logic state of the memory device. An absence of the charge carriers within the array of nanocrystals represents a second logic state of the memory device. The presence and the absence of the charge carriers is determinable via directing a beam of photons onto the array of nanocrystals and sensing an optical response.

27 Claims, 6 Drawing Sheets

U.S. PATENT DOCUMENTS

| | | | |
|---|---|---|---|
| 5,508,829 | A | 4/1996 | Freeouf et al. |
| 5,550,670 | A | 8/1996 | Zielinski et al. |
| 5,825,525 | A | 10/1998 | Harwit |
| 5,920,419 | A | 7/1999 | Starck et al. |
| 6,100,543 | A | 8/2000 | Sakata |
| 6,301,155 | B1* | 10/2001 | Fujiwara ................ 365/185.18 |
| 6,309,907 | B1* | 10/2001 | Forbes et al. ............... 438/105 |
| 6,337,117 | B1* | 1/2002 | Maenosono et al. ....... 428/64.1 |
| 6,475,886 | B1* | 11/2002 | Kim et al. ................. 438/515 |
| 6,574,144 | B1* | 6/2003 | Forbes .................. 365/185.18 |
| 6,586,785 | B1* | 7/2003 | Flagan et al. ............... 257/261 |
| 6,633,370 | B1* | 10/2003 | Lawandy ..................... 356/71 |
| 6,753,568 | B1* | 6/2004 | Nakazato et al. ........... 257/314 |
| 6,781,690 | B1* | 8/2004 | Armstrong et al. ......... 356/301 |
| 6,808,986 | B1* | 10/2004 | Rao et al. .................. 438/257 |
| 6,846,565 | B1* | 1/2005 | Korgel et al. ............... 428/402 |
| 2003/0111672 | A1* | 6/2003 | Cavins et al. ............... 257/202 |
| 2004/0002202 | A1* | 1/2004 | Horsky et al. .............. 438/515 |
| 2004/0024959 | A1* | 2/2004 | Taylor ....................... 711/105 |
| 2005/0122775 | A1* | 6/2005 | Koyanagi et al. ...... 365/185.11 |

OTHER PUBLICATIONS

Wang, H. et al., "Ultrafast recovery Time in a Strained InGaAs-AIAs p-i-n Modulator," *IEEE Photonics Technology Letters*, vol. 7, No. 2, (Feb. 1995), pp. 173-175.

Castagna, M. E. et al., "Quantum Dot Materials and Devices for Light Emission in Silicon," STMicroelectronics, 95121, Cantania, Italy, (2002), pp. 439-442.

http://hyperphysics.phy-astr.qsu.edu, "Stark Effect in Atomic Spectra," (Apr. 16, 2003).

* cited by examiner

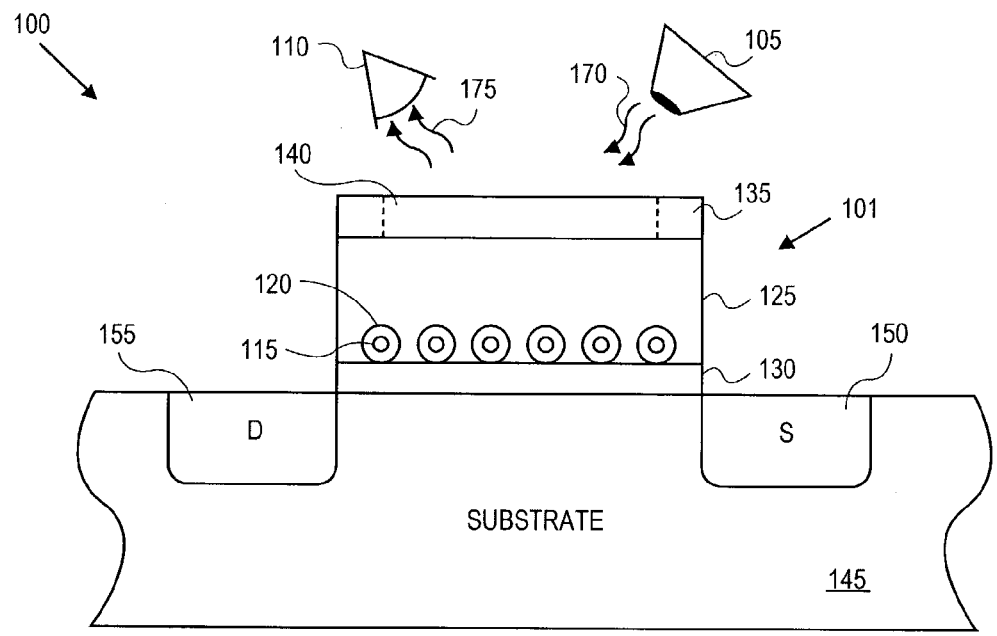
FIG. 1A
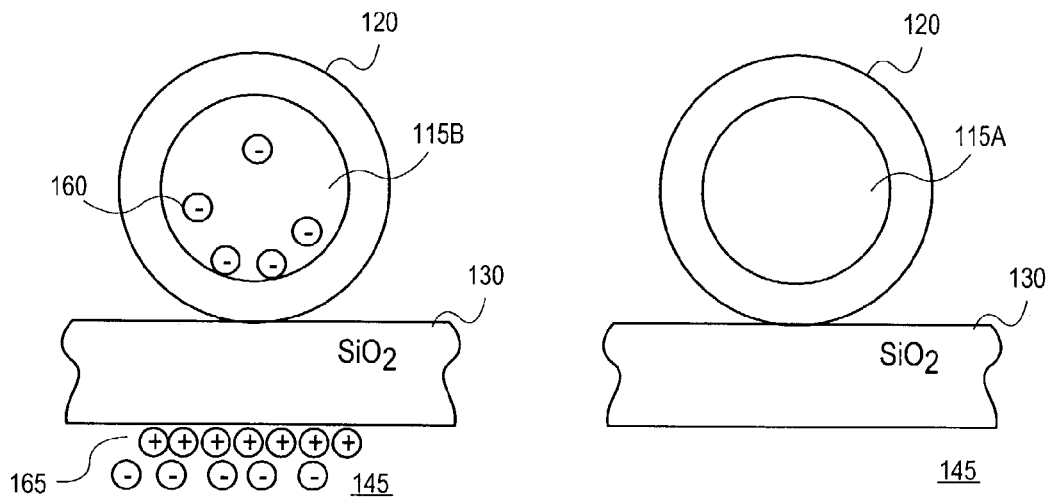
FIG. 1C  FIG. 1B

ELECTRO-OPTICAL NANOCRYSTAL MEMORY DEVICE

CROSS-REFERENCE TO RELATED APPLICATIONS

The present application claims the benefit of the filing date, under 35 U.S.C. § 119(e), of U.S. application Ser. No. 60/389,589, which is a provisional application entitled, "Semiconductor Nanocrystal Optical Memory Devices" filed on Jun. 18, 2002.

TECHNICAL FIELD

This disclosure relates generally to memory devices, and in particular but not exclusively, relates to electro-optical hybrid memory devices based on a nanocrystal structure.

BACKGROUND INFORMATION

Nonvolatile semiconductor memories use a variety of semiconductor memory cell designs. One type of memory cell uses an electrically isolated floating gate to trap charge. A variety of mechanisms can be used to insert charge onto the floating gate and to pull charge from the floating gate (i.e., "write" to the memory cell). Electron tunneling can be used both to inject charge and to pull charge off the floating gate of a memory cell. Hot electron injection is another mechanism for inserting charge onto a floating gate of a memory cell. Other nonvolatile semiconductor memories use a trapping dielectric to insert or remove charge from between a control gate of a memory cell and the silicon substrate.

A typical prior art memory cell is capable of achieving one of two possible logic states, being either "programmed" or "erased". In the case of an erasable programmable read only memory ("EPROM") cell, a select gate is formed above a floating gate within an oxide layer. The oxide layer is further formed above a silicon substrate between a source and a drain. Data is stored in the memory cell by altering the amount of charge on the floating gate. In a case where negative charge is drawn onto the floating gate, electrons in the substrate below the floating gate are repelled. This implies that to form an n-channel in the substrate between the source and drain, a larger positive voltage must be applied to the select gate than is required when the floating gate is not charged. In other words, the threshold voltage $V_t$ of the memory cell is higher when the floating gate is charged. In fact, charging the floating gate causes the drain current vs. gate-source voltage ($i_D$-$v_{GS}$) characteristic of the memory cell to shift. By measuring the threshold voltage or shifts in the $i_D$-$v_{GS}$ characteristics, the logic state of a memory cell can be "read".

The above-mentioned methods of writing and reading a memory cell are strictly electrical in nature. To interface these memory devices with optical circuits requires optical-to-electrical and/or electrical-to-optical conversions. Such conversions are inherently inefficient, adding circuit complexity and wasting valuable silicon real estate.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 1A is a block diagram illustrating a memory cell, in accordance with an embodiment of the present invention.

FIG. 1B is a block diagram illustrating an uncharged nanocrystal, in accordance with an embodiment of the present invention.

FIG. 1C is a block diagram illustrating a charged nanocrystal, in accordance with an embodiment of the present invention.

DETAILED DESCRIPTION

Figure 2:
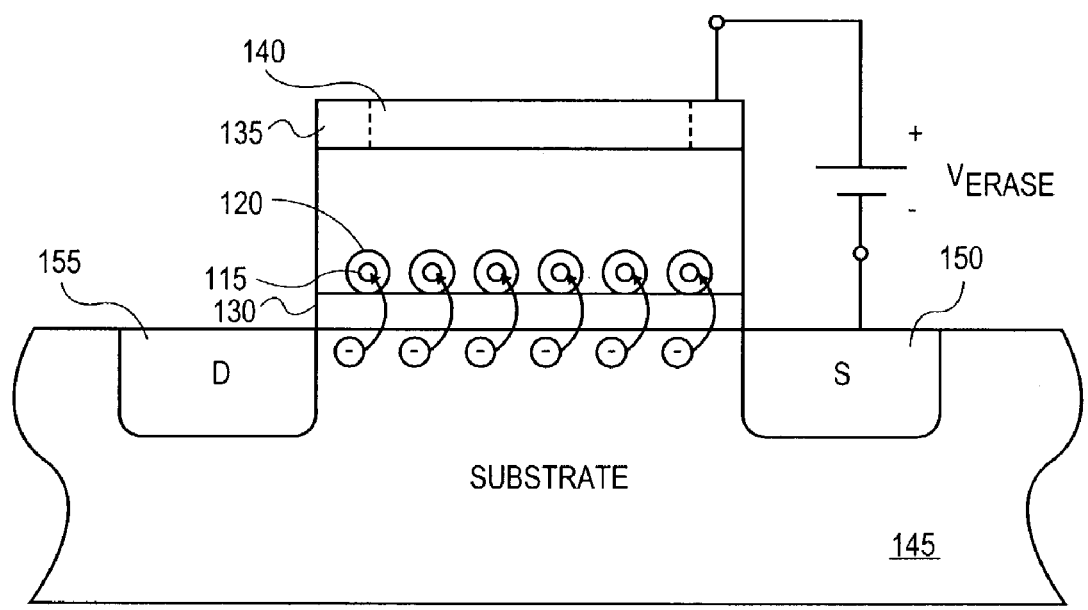
FIG. 2 is a block diagram illustrating electrical erasing of a memory cell, in accordance with an embodiment of the present invention.

Embodiments of a system and method for reading and/or writing optical and/or electrical data to a memory device are described herein. In the following description numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. "Reading" a memory cell is defined herein to be the act of determining the logic state of the memory cell. An "optical read" is accomplished in the optical realm using optical techniques. An "electrical read" is accomplished in the electrical realm using electrical techniques. An "electro-optic read" is a hybrid read accomplished using both optical and electrical techniques. "Writing" to a memory cell is defined herein to be the act of changing the logic state of the memory cell. Memory cells contemplated herein have two logic states corresponding to a "charged state" and a "neutral state." Thus, writing to a memory cell includes changing the logic state of the memory cell from the neutral state to the charged state (also referred to as "erasing") and changing the logic state of the memory cell from the charged state to the neutral state (also referred to as "programming").

In short, embodiments of the present invention include a nanocrystal structure based nonvolatile memory cell that can be programmed, erased, and read both optically and electrically. Data is stored as the charge state of the nanocrystal structures. In one embodiment, the nanocrystal structures are embedded within a floating gate of a metal oxide semiconductor ("MOS") field effect transistor ("FET"). Embodiments of the present invention include nanocrystal structures formed of silicon (Si), gallium-arsenide (GaAs), tin (Sn), and other optically active elements or alloys that illuminate dependent upon the presence or absence of charge carriers. These and other embodiments are described in detail below.

FIG. 1A is a block diagram illustrating a memory device 100, according to one embodiment of the present invention. In the illustrated embodiment, memory device 100 includes a memory cell 101, an optical source 105, and an optical sensor 110. In the illustrated embodiment, memory cell 101 further includes nanocrystals 115, insulators 120, a control layer 125, a tunneling layer 130, a contact 135 having a transparent region 140, a substrate 145, a source region 150, and a drain region 155.

Substrate 145 is an integral part of and provides mechanical support for memory cell 101. In one embodiment, substrate 145 is a silicon based p-type substrate or p-doped well within a n-type substrate and source region 150 and drain region 155 are n-doped regions. In another embodiment, substrate 145 is a silicon based n-type substrate or n-doped well within a p-type substrate and source region 150 and drain region 155 are p-doped regions. In yet another embodiment, substrate 145 may include quartz or other similar materials. Tunneling layer 130 is formed on substrate 145 between source region 150 and drain region 155. In one embodiment, tunneling layer 130 is silicon dioxide ($SiO_2$) and approximately 3 nm to 7 nm thick. In one embodiment, tunneling layer 130 represents a structured layered dielectric to provide a layered tunnel barrier, as is known to one of ordinary skill in the art. The structured layered dielectric allows for less energetic tunneling of charge carriers through tunneling layer 130. Control layer 125 is formed above tunneling layer 130. In one embodiment, control layer 125 is formed of $SiO_2$ approximately 5 nm to 15 nm thick.

Contact 135 is formed on control layer 125 and includes an electrically conductive material for applying a bias voltage between contact 135 and substrate 145. Contact 135 further includes transparent region 140 to allow photons to enter and to exit memory cell 101. In one embodiment, contact 135 is polysilicon patterned to form a square ring with an etched out middle section to form transparent region 140. In one embodiment, transparent region 140 is filled with the same material as control layer 125. The shape and thickness of the patterned embodiment of contact 135 is not critical, as long as photons in the infrared, visible, and/or ultraviolet spectrum can enter and exit contact 135 to interact with nanocrystals 115. In an alternative embodiment, contact 135 and transparent region 140 form a solid layer of polysilicon that is sufficiently thin to allow transmission of photons in and out of memory cell 101. Embodiments of contact 135 including the layer of polysilicon may have a thickness ranging between 20 nm and 200 nm. In other embodiments, contact 135 is formed of a transparent layer of indium-tin-oxide, a patterned layer of metal, or the like. In all embodiments, contact 135 should be sufficiently conductive to apply a uniform field across nanocrystals 115.

In one embodiment, a lateral dimension of tunneling layer 130, control layer 125, and contact 135 is 100 microns, but can be considerably smaller. The lateral dimension of memory cell 101 affects the intensity of photons 175 emitted from memory cell 101 during optical reads, discussed in further detail below. The smaller the lateral dimension, the less intense photons 175 become. Thus, there is a tradeoff between size and emitted intensity.

Nanocrystals 115 are formed within control layer 125 above tunneling layer 130. In one embodiment, nanocrystals 115 are positioned to form a substantially planar array above tunneling layer 130. In one embodiment, each of nanocrystals 115 is formed within a corresponding one of insulators 120. The junction between nanocrystals 115 and insulators 120 chemically passivates nanocrystals 115 and determines how well nanocrystals 115 will illuminate. The material used to form insulators 120 may be adjusted to optimize emission characteristics of nanocrystals 115.

FIG. 1B is a block diagram illustrating an uncharged or neutral nanocrystal 115A, in accordance with an embodiment of the present invention. In one embodiment, insulators 120 are made of $SiO_2$, but other electrically insulating materials penetrable by photons in at least one of the infrared, visible, and ultraviolet spectrums may also be used. In one embodiment, nanocrystals 115 are made of Si. Alternative embodiments include nanocrystals made of GaAs, Sn, and other suitable elements or alloys known in the art. In one embodiment, nanocrystals 115 are formed by ion implantation and subsequent annealing. In one embodiment, insulators 120 are formed around nanocrystals 115 using aerosol deposition, as is known in the art. In one silicon nanocrystal embodiment, Si ions are implanted into an insulating layer with an implantation energy of 5 keV and a dose of $1.27 \times 10^{16}$ cm$^{-2}$. Si nanocrystals 115 are then formed by annealing the Si implanted insulating layer. Annealing times can vary depending upon the desired size of nanocrystals 115. In one embodiment, the implanted Si is annealed for approximately 30 minutes or until the nanocrystals reach a diameter of 5 nm to 10 nm. The Si implanted insulating layer having nanocrystals 115 formed therein is subsequently etched to form insulators 120 having nanocrystals 115 therein. Next, control layer 125 is formed over insulators 120.

It should be appreciated that only one embodiment of memory cell 101 is illustrated in FIG. 1A. As discussed above, embodiments of memory cell 101 include tunneling layer 130, insulators 120, and control layer 125 made of $SiO_2$. In an alternative embodiment where all three above elements are $SiO_2$, tunneling layer 130, insulators 120, and control layer 125 may be formed of a single oxide layer having nanocrystals 115 formed in a planar array and formed an appropriated distance (e.g., 3 nm to 7 nm) above substrate 145. In one embodiment, an appropriate distance is a distance that provides a sufficient potential barrier to prevent charge carriers 160 from seeping out of nanocrystals 115, while at the same time allowing charge carriers 160 to migrate between substrate 145 and nanocrystals 115 when stimulated, as discussed in detail below. In this alternative embodiment, nanocrystals 115 are formed by implanting Si ions and annealing the single oxide layer, as discussed above. In one embodiment, nanocrystals 115 are implanted 9 nm into a 15 nm thick single oxide layer with an implantation energy of 5 keV.

FIG. 1C is a block diagram illustrating a charged nanocrystal 115B, in accordance with an embodiment of the present invention. Charge carriers 160 held within nanocrystal 115B impart a net charge to nanocrystal 115B. In FIG. 1C, charge carriers 160 are illustrated as trapped electrons imparting a net negative charge to nanocrystal 115B; however, the present discussion is equally applicable to embodiments where charge carriers 160 represent holes. Charge carriers 160 are held within nanocrystal 115B by insulator 120 and tunneling layer 130. The number of charge carriers 160 present within nanocrystal 115B can be one or more and will increase with increasing diameter of nanocrystals 115. Charge carriers 160 within nanocrystal 115B attract charge carriers of an opposite charge within substrate 145. Thus, in the embodiment where charge carriers 160 represent electrons, the electrons held within nanocrystal 115B attract positively charged holes and repel negatively charged electrons within substrate 145. When all or a substantial majority of nanocrystals 115 are negatively charged, a positively charged channel region 165 beneath tunneling layer 130 between source region 150 and drain region 155 is formed.

Accordingly, nanocrystals 115A and 115B correspond to the two logic states of memory cell 101. When all or a substantial portion of nanocrystals 115 are uncharged, as illustrated in FIG. 1B, memory cell 101 is in the neutral state. When all or a substantial majority of nanocrystals 115 are charged, as illustrated in FIG. 1C, memory cell 101 is in the charged state.

Returning to FIG. 1A, the illustrated embodiment of memory cell 101 is conveniently configured in the form of a traditional MOSFET, with tunneling layer 130, control layer 125, and contact 135 forming a floating gate. This transistor configuration has a number of advantages, which will become apparent below. However, other embodiments of memory cell 101 need not include elements such as source region 150 and drain region 155. In fact, nanocrystals 115 need only be formed within an optically accessible electrical insulator that is proximate to a readily available source of charge carriers.

It should be appreciated that the materials, dimensions, and wavelengths utilized in the embodiments discussed in connection with FIGS. 1A, 1B, and 1C are provided for explanation purposes and that other materials, dimensions, and wavelengths may be utilized in accordance with the teachings of the present invention. The relative size, shape and distances between the various elements of memory device 100 are in some instances exaggerated for clarity and are not necessarily shown to scale.

FIG. 2 is a block diagram illustrating electrical erasing of memory cell 101, in accordance with an embodiment of the present invention. As defined above, electrically erasing memory cell 101 constitutes charging nanocrystals 115 by drawing charge carriers 160 from substrate 145 into each of nanocrystals 115. In one embodiment, a voltage $V_{ERASE}$ is applied between source region 150 (and/or drain region 155) and contact 135. $V_{ERASE}$ generates an electrostatic field between the floating gate and substrate 145. This electrostatic field draws charge carriers 160 in the vicinity of tunneling layer 130 to migrate from a conduction band in substrate 145, up through tunneling layer 130, and into conduction bands of each of nanocrystals 115. A number of techniques may be used to promote migration of charge carriers 160 from substrate 145 into nanocrystals 115, including: quantum mechanical electron tunneling, channel hot electron injection by applying a large voltage across source region 150 and drain region 155, or simply by applying a sufficiently large $V_{ERASE}$ for charge carriers 160 to overcome the potential barrier imposed by tunneling layer 130 and insulators 120. In one embodiment, a layered tunnel barrier is used to promote migration of charge carriers 160 through tunneling layer 130 at a lower $V_{ERASE}$, as described above.

Once all or a substantial majority of nanocrystals 115 absorb one or more charge carriers 160, $V_{ERASE}$ is turned off, thereby trapping charge carriers 160 within nanocrystals 115 and placing memory cell 101 in the charged state. If left undisturbed, memory cell 101 will remain in the charged state for a substantial period of time, before charge carriers 160 seep back into substrate 145. Charge carriers 160 seep back into substrate 145 via quantum mechanical tunneling, a statistically driven process dependent upon the energy states available in the conduction bands of both nanocrystals 115 and substrate 145, the height of the potential barrier imposed by tunneling layer 130, and the physical thickness of tunneling layer 130. Thus, some embodiments of the present invention may further include a refresh circuit, as known in the art.

Figure 3:
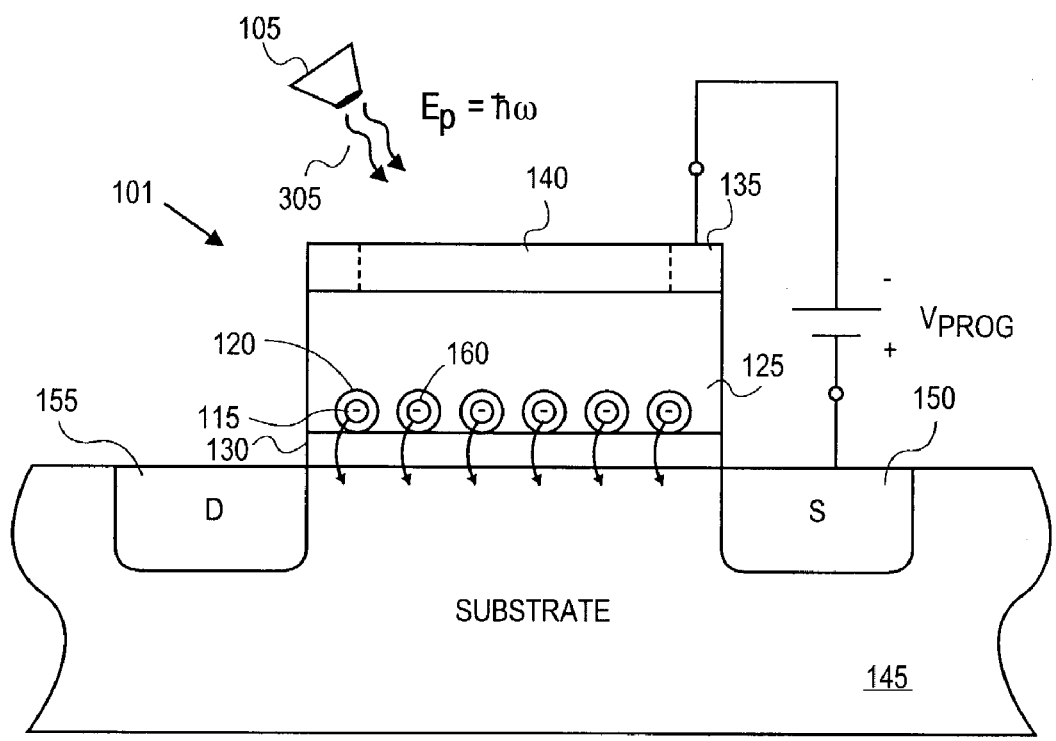
FIG. 3 is a block diagram illustrating optical programming of a memory cell, in accordance with an embodiment of the present invention.

FIG. 3 is a block diagram illustrating optical programming of memory cell 101, in accordance with an embodiment of the present invention. Optical programming of memory cell 101 constitutes stimulating charged nanocrystals 115 with photons 305, imparting enough energy to charge carriers 160 trapped within nanocrystals 115 to allow them to return to substrate 145. Energy is transferred from photons 305 to charge carriers 160 trapped in nanocrystals 115, such as electrons, when a photon 305 comes within the vicinity of an electron and is absorbed by the electron. The energy imparted causes the electron to jump to a higher energy state within the conduction band of nanocrystal 115 with enough energy to overcome the potential barrier imposed by tunneling layer 130 and thereby escape to the conduction band of substrate 145. The energy of photons 305 are determined by Planck's formula:

$$E_P = \hbar \cdot \omega \qquad (1)$$

where $E_P$ represents photon energy, $\hbar$ is Plank's constant $(1.05457 \times 10^{-34} \text{ J} \cdot \text{s})$, and $\omega$ represents the angular frequency of photons 305. Accordingly, the programming beam emitted by optical source 105 must have photons 305 of sufficient frequency to impart enough energy to electrons trapped in nanocrystals 115 to surmount the potential barrier imposed by tunneling layer 130. Thus, in one embodiment, optically programming memory cell 101 consists of illuminating nanocrystals 115 with a beam of photons 305 having a wavelength falling within one of the infrared, visible, and ultraviolet spectrums (e.g., 488 nm to 510 nm).

In one embodiment, a voltage $V_{PROG}$ is applied between source region 150 (and/or drain region 155) and contact 135. $V_{PROG}$ generates an electrostatic field between the floating gate and substrate 145 having a reversed polarity as that generated by $V_{ERASE}$. This electrostatic field has the effect of promoting the escape of charge carriers 160 held within nanocrystals 115 by lowering the effective height of the potential barrier imposed by tunneling layer 130. In one embodiment, $V_{PROG}$ is applied in conjunction with illuminating nanocrystals 115 with photons 305 and therefore constitutes a hybrid electro-optical write of memory cell 101. In one embodiment, a strictly electrical programming may be executed by applying a greater $V_{PROG}$ without illuminating nanocrystals 115 with photons 305. Thus, embodiments of the present invention provide techniques to electrically, optically, and electro-optically program memory cell 101.

Turning now to FIGS. 1A through 1C and FIGS. 4A and 4B, a photoluminescence technique for optically reading embodiments of memory cell 101 is described. In one photoluminescence embodiment, an optical read of memory cell 101 is accomplished by directing a beam 170 of photons generated by optical source 105 through transparent region 140 to interact with nanocrystals 115. If memory cell 101 is in the neutral state, then nanocrystals 115 will emit photons 175, which are detectable by optical sensor 110. If memory cell 101 is in the charged state, then nanocrystals 115 will not emit photons 175 and thus will appear dark to optical sensor 110. In one embodiment, beam 170 used for reading memory cell 101 has a wavelength approximately equal to 780 nm. In one embodiment, photons 175 emitted by memory cell 101 in the neutral state have a wavelength approximately equal to 850 nm. In one embodiment, beam 170 is selectively directed onto memory cell 101 via a waveguide, such as an optical fiber (not shown).

Figure 4A:
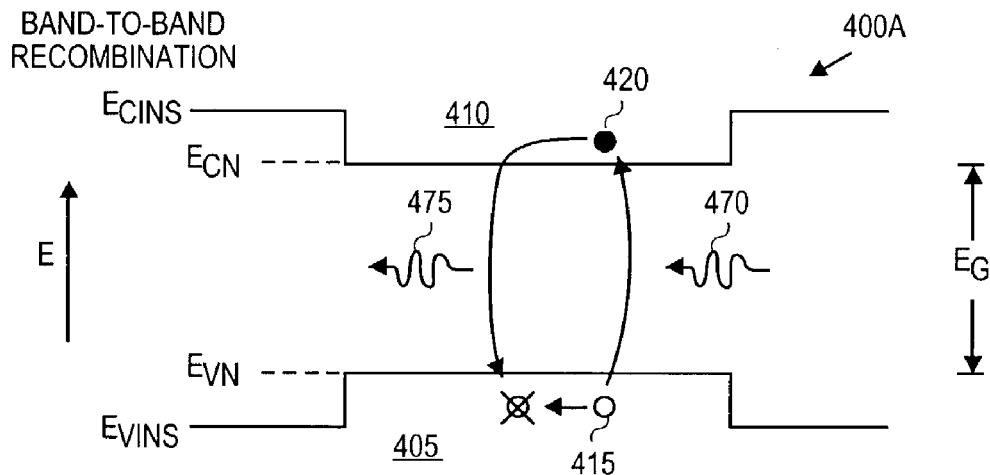
FIG. 4A is an energy band diagram illustrating a photoluminescence read of a neutral nanocrystal, in accordance with an embodiment of the present invention.

FIG. 4A illustrates one embodiment of an energy band diagram 400A for depicting a photoluminescence read of neutral nanocrystal 115A, in accordance with an embodiment of the present invention. Energy band diagram 400A is a conceptual illustration of energy states available to charge carriers 160 held within one of nanocrystals 115. Energy band diagram 400A includes a valence band 405 having a high-end energy level $E_{VN}$ within nanocrystals 115 and a high-end energy level $E_{VINS}$ within insulators 120. Energy band diagram 400A further includes a conduction band 410 having a low-end energy level $E_{CN}$ within nanocrystals 115 and a low-end energy level $E_{CINS}$ within insulators 120. The abrupt steps between $E_{CN}$ and $E_{CINS}$ and between $E_{VN}$ and $E_{VINS}$ are associated with the physical junction between nanocrystals 115 and insulators 120. Conduction band 410 is separated from valence band 405 within nanocrystals 115 by a band gap energy $E_G$, where $$E_G = E_{CN} - E_{VN} \quad (2)$$

The band gap region between conduction band 410 and valence band 405 is a region of forbidden energy states where charge carriers 160, such as electrons, cannot exist. This forbidden region of energy states is a result of interatomic forces between Si atoms brought together at distances corresponding to the Si lattice spacing. Band gap energy $E_G$ is dependent upon the diameter of nanocrystals 115 and is therefore referred to as a quantum confined band gap. In general, energy states in valence band 405 are mostly occupied and energy states in conduction band 410 are mostly empty.

An optical read of neutral or uncharged nanocrystal 115A is now discussed in connection with FIG. 4A to illustrate the interactions between a photon 470 (corresponding to beam 170 in FIG. 1A) and an emitted photon 475 (corresponding to photons 175 in FIG. 1A). Photon 470 is incident upon neutral nanocrystal 115A. When photon 470 comes within the vicinity of electron 420, initially residing in valence band 405, it has a probability of being absorbed by electron 420, if the energy of photon 470 is greater than band gap energy $E_G$. As discussed above, energy $E_P$ of photon 470 is related to frequency ω of photon 470, according to equation 1. In the case of absorption, the energy of photon 470 is absorbed by electron 420 creating an exciton (electron-hole pair) with electron 420 excited into conduction band 410 along a path 425 and a hole 415 remaining in valence band 405. Electron 420 will recombine with hole 415 in a process called band-to-band radiative recombination along a path 430 after a statistically determinable recombination time. When electron 420 drops from conduction band 410 into valence band 405 along path 430, its excess energy is released in the form of emitted photon 475 and hole 415 is annihilated. This process occurs in all or a substantial portion of nanocrystals 115, when all or a substantial portion (e.g., as low as 10%) of nanocrystals 115 are uncharged and stimulated by beam 170. Photons 175, corresponding to emitted photon 475 summed over all nanocrystals 115, are detected by optical sensor 110 to determine that memory cell 101 is in the neutral state. Photon 475 (also photons 175) will have a wavelength dependent upon band gap energy $E_G$, which is in turn dependent upon the diameter of nanocrystals 115, and dependent upon the materials used to form nanocrystals 115 and insulators 120.

In yet another embodiment, a bias voltage is applied between contact 135 and source region 150 (and/or drain region 155) having the same polarity as $V_{ERASE}$, to ensure that charge carriers 160 remain within nanocrystals 115 while illuminated by beam 170 during the read process. This embodiment is referred to as an electro-optical read of memory cell 101.

Figure 4B:
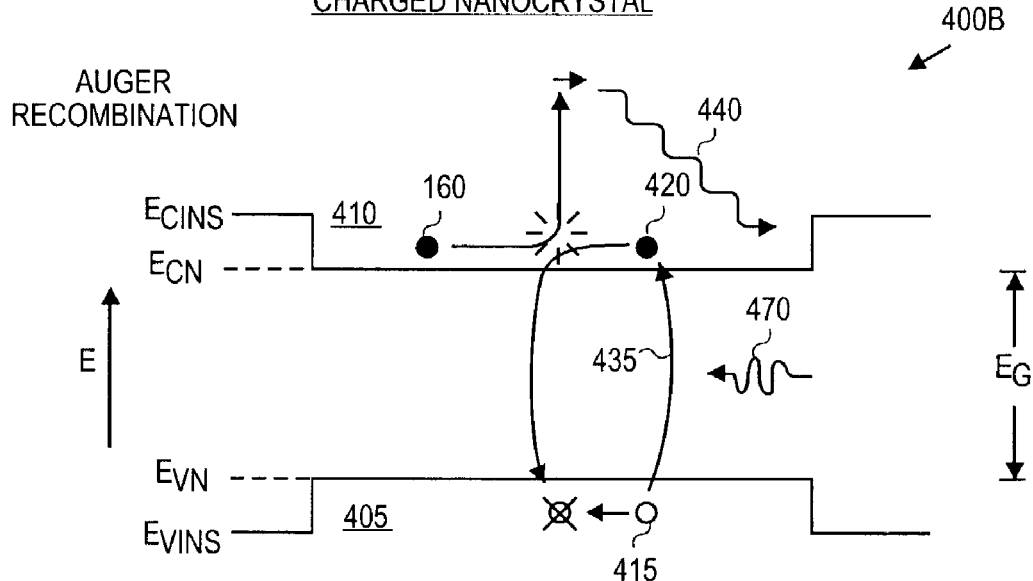
FIG. 4B is an energy band diagram illustrating a photoluminescence read of a charged nanocrystal, in accordance with an embodiment of the present invention.

FIG. 4B illustrates one embodiment of an energy band diagram 400B for depicting a photoluminescence read of charged nanocrystal 115B, in accordance with an embodiment of the present invention. Photon 470 is incident upon charged nanocrystal 115B having at least one excess charge carrier 160, an electron in this case, present in conduction band 410. When photon 470 enters nanocrystal 115B, it has a probability of being absorbed by one of many electrons 420 present in valence band 405, if the energy of photon 470 is greater than band gap energy $E_G$. In the case of absorption, electron 420 is excited into conduction band 410 along a path 435. With both electron 420 and charge carrier 160 (also an electron) both in conduction band 410 of nanocrystal 115B, there is a high probability that the two electrons will collide sending charge carrier 160 higher into conduction band 410 and dropping electron 420 back into valence band 405, where electron 420 nonradiatively recombines with hole 115. Electron 420 recombines with hole 115 without emitting a photon because the excess energy of electron 420 was imparted to charge carrier 160 in their collision. This process is known as Auger recombination. Charge carrier 160 will relax back to its initial energy level along a path 440 via nonradiative thermal interactions.

When excess charges in the form of one or more of charge carriers 160 are present in conduction band 410 of nanocrystal 115B, the nonradiative auger recombination is dominant over the radiative band-to-band recombination. Thus, memory cell 101 will appear dark to sensor 110, and the logic state of memory cell 101 will be determined as a charged state.

Turning now to FIGS. 1A through 1C and FIGS. 5A and 5B, an absorption/transmission technique for optically reading the logic state of memory cell 101 is described. An optical read of memory cell 101 is accomplished by directing beam 170 of photons having an energy $E_P$ less than band gap energy $E_G$ onto nanocrystals 115. In one embodiment, if memory cell 101 is in the neutral state, then beam 170 will transmit through memory cell 101 without being absorbed by nanocrystals 115. By positioning optical sensor 110 below memory cell 101, an intensity of beam 170 can be measured. In one embodiment, if memory cell 101 is in the charged state, then charge carriers 160 present within nanocrystals 115 will absorb a portion of beam 170 resulting in a less intense beam 170 received by optical sensor 110. In an alternative embodiment, a reflective surface is embedded within substrate 145 beneath memory cell 101 for beam 170 to reflect off and exit out transparent region 140 to be received by optical sensor 110.

Figure 5A:
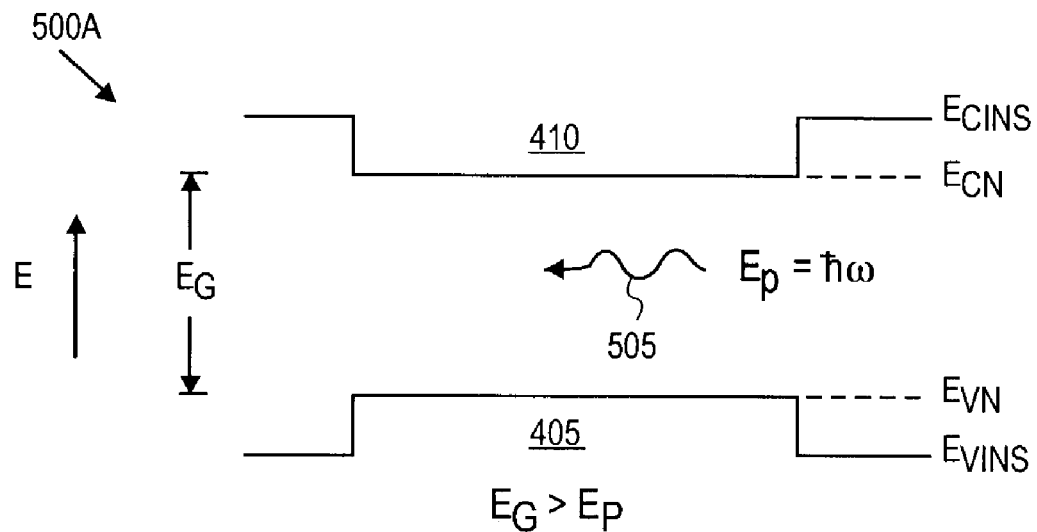
FIG. 5A is an energy band diagram illustrating an absorption/transmission read of a neutral nanocrystal, in accordance with an embodiment of the present invention.

FIG. 5A illustrates one embodiment of an energy band diagram 500A depicting an absorption/transmission read of uncharged nanocrystal 115A, in accordance with an embodiment of the present invention. A photon 505 (corresponding to beam 170 in FIG. 1A) having an energy $E_P$ less than the band gap energy $E_G$ passes through nanocrystal 115A. Since photon 505 has insufficient energy to excite electrons in valence band 405 into the conduction band 410, photon 505 is not absorbed and an exciton (electron-hole pair) is not generated. Accordingly, photon 505 passes through nanocrystal 115A without being absorbed.

Figure 5B:
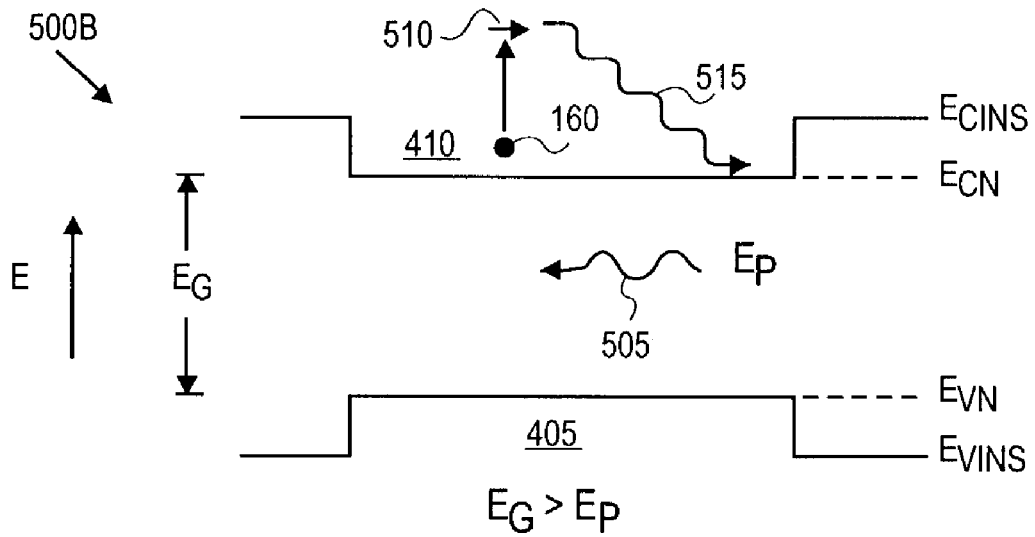
FIG. 5B is an energy band diagram illustrating an absorption/transmission read of a charged nanocrystal, in accordance with an embodiment of the present invention.

FIG. 5B illustrates one embodiment of an energy band diagram 500B depicting an absorption/transmission read of charged nanocrystal 115B, in accordance with an embodiment of the present invention. In this embodiment, charge carrier 160 (an electron) is occupying an energy state within conduction band 410 of nanocrystal 115B. Since energy $E_P$ of photon 505 is less than band gap energy $E_G$, photon 505 is not absorbed by electrons occupying energy states within valence band 405. However, charge carrier 160 is present in conduction band 410 and thus can absorb photon 505, causing charge carrier 160 to rise to a higher energy state 510 within conduction band 410. Charge carrier 160 subsequently nonradiatively relaxes to the lowest unoccupied energy state within conduction band 410 via thermal interactions. In this manner, charged nanocrystal 115B absorbs incident photon 505 without emitting another photon.

In yet another embodiment, the logic state of memory cell 101 can be optically read by monitoring the reflectivity of nanocrystals 115. Referring to FIG. 1A, the presence or absence of charge carriers 160 within nanocrystals 115 changes the polarizability of nanocrystals 115. This in turn influences the magnitude of reflection of beam 170 off nanocrystals 115. Therefore, in this embodiment, by monitoring the reflectivity of nanocrystals 115 with optical sensor 110, the logic state of memory cell 101 is determined.

FIGS. 4A through 5B illustrate optical techniques to read memory cell 101. However, embodiments of the present invention also provide for electrical reads of memory cell 101. As mentioned above, the transistor configuration illustrated in FIGS. 1A, 2 and 3 have several advantages. One such advantage is the ability to electrically read the logic state of memory cell 101 in addition to the optical techniques discussed above. Referring to FIG. 1C, charged nanocrystal 115B promotes the creation of channel region 165 beneath tunneling layer 130 in substrate 145, between source region 150 and drain region 155. Resultantly, the charged state of memory cell 101 has a different threshold voltage between source region 150 and drain region 155 for turning the transistor on, as compared with the neutral state of memory cell 101. Accordingly, the threshold voltage or $i_D$-$v_{GS}$ characteristics of the transistor can be electrically measured to determine the logic state of memory cell 101. In this manner, embodiments of the present invention can be integrated with silicon based electronics and existing CMOS technologies.

Figure 6:
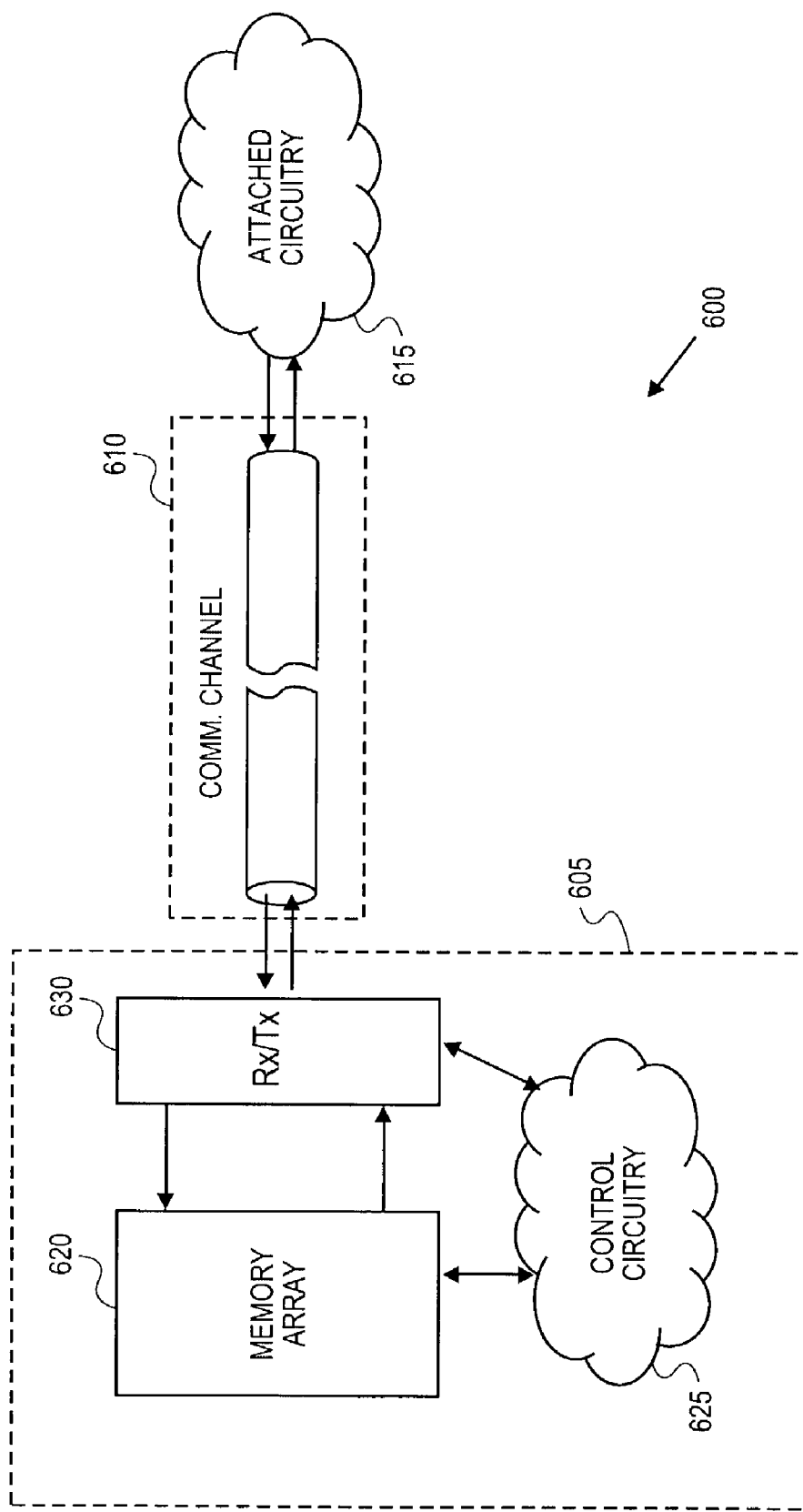
FIG. 6 is a block diagram illustrating a system for reading and/or writing optical and/or electrical data to a memory array, in accordance with an embodiment of the present invention.

FIG. 6 is a block diagram illustrating a system 600 to read data electrically and/or optically from a memory array and to write data electrically and/or optically to the memory array. The illustrated embodiment of system 600 includes memory circuit 605, optical communication channel 610 and attached circuitry 615. In one embodiment, memory circuit 605 further includes memory array 620, control circuitry 625, and transceiver 630.

In one embodiment, memory array 620 includes a plurality of memory cells 101 integrated onto substrate 145. Transceiver 630 is operatively coupled to memory array 620 to store optical data thereto received via optical communication channel 610 and to transmit data read from memory array 620 to optical communication channel 610. In one embodiment, control circuit 625 is operatively coupled to transceiver 630 to control data flow to/from memory array 620. In one embodiment, control circuitry 625 is further electrically coupled to memory array 620 to electrically write data to and read data from memory array 620.

In one embodiment, transceiver 630 includes optical source 105 and optical sensor 110. In one embodiment, optical communication channel is an optical data bus, such as an optical fiber, for operatively coupling memory circuit 605 to attached circuitry 615. System 600 may be subcomponents of a computer system or even be subcomponents of a telecommunication system. It will be appreciated by those of ordinary skill in the art that memory array 620 may be used in any number of devices where storing optical data and/or electrical data is desirable.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method of reading a memory device, comprising:
    directing a beam of first photons onto an array of insulated nanocrystals formed proximate to a substrate; and
    sensing an optical response to the beam of the first photons from the array of insulated nanocrystals to determine whether the memory device is in one of a first logic state or a second logic state,
    wherein the first photons have an energetic level equal to at least a band gap energy between a valence band and a conduction band of the insulated nanocrystals and wherein the optical response includes second photons emitted from the insulated nanocrystals, an absence of a threshold amount of the second photons indicating that the memory device is in the first logic state, a presence of at least the threshold amount of the second photons indicating that the memory device is in the second logic state.

2. The method of claim 1 wherein directing the beam of first photons further includes directing the beam of first photons onto a substantially planar array of insulated nanocrystals.

3. The method of claim 2 wherein the array of insulated nanocrystals is embedded within a floating gate insulating layer of a transistor formed on a semiconductor substrate.

4. A method of claim 3 wherein the beam of first photons is directed through a transparent region of an electrically conductive contact formed on the floating gate insulating layer.

5. The method of claim 3, further comprising measuring a threshold voltage of the transistor to electrically determine whether the memory device is in one of the first logic state or the second logic state.

6. A memory device, comprising:
a substrate;
an array of nanocrystals formed proximate to the substrate, the array of nanocrystals being electrically insulated to hold charge carriers therein, a presence of a threshold amount of the charge carriers to represent a first logic state of the memory device and an absence of the threshold amount of the charge carriers to represent a second logic state of the memory device; and
an optically transmissive region disposed proximate to the array of nanocrystals to allow photons to enter and exit the memory device, the presence and the absence of the threshold amount of the charge carriers determinable via directing a first beam of photons through the optically transmissive region onto the array of nanocrystals and sensing an optical response.

7. The memory device of claim 6 wherein the array of nanocrystals is electrically insulated by an insulating layer formed on the substrate and having the array of nanocrystals embedded therein.

8. The memory device of claim 7, further comprising an electrically conductive contact proximate to the insulating layer, the electrical contact including the optically transmissive region to allow the first beam of photons to enter and penetrate the insulating layer to interact with the array of nanocrystals and to allow second photons to exit after emission from the array of nanocrystals.

9. The memory device of claim 8 wherein the array of nanocrystals is positioned within the insulating layer to allow the charge carriers to migrate between the array of nanocrystals and the substrate when stimulated.

10. The memory device of claim 9 wherein the stimulation includes a second beam of photons incident upon the array of nanocrystals to cause the charge carriers to migrate from the array of nanocrystals to the substrate.

11. The memory device of claim 9 wherein the stimulation includes a voltage applied between the electrically conductive contact and the substrate to cause the charge carriers to migrate from the substrate to the array of nanocrystals.

12. The memory device of claim 6 wherein the array of nanocrystals is insulated by a plurality of insulators, each one of the plurality of insulators insulating a corresponding nanocrystal of the array of nanocrystals.

13. The memory device of claim 12, further comprising a control layer formed proximate to the substrate and having the plurality of insulator formed therein.

14. The memory device of claim 13, further comprising a tunneling layer formed between the substrate and the control layer, the tunneling layer to allow the charge carriers to migrate between the substrate and the array of nanocrystals when optically stimulated.

15. The memory device of claim 6 wherein the nanocrystal array is substantially planar.

16. The memory device of claim 6 wherein the insulating layer comprises a floating gate insulator of a field effect transistor.

17. The memory device of claim 6 wherein each nanocrystal of the nanocrystal array comprises silicon.

18. The memory device of claim 6, further comprising an optical source to generate the first beam of photons and an optical sensor to sense the optical response.

19. A system, comprising:
an optical communication channel to send and to receive optical data; and
a memory array operatively coupled to send the optical data to and to receive the optical data from the optical communication channel, the memory array including a plurality of memory cells, the memory cells each including:
a substrate;
an array of nanocrystals proximate to the substrate, the array of nanocrystals being electrically insulated to hold charge carriers therein, a presence of a threshold amount of the charge carriers to represent a first logic state of the memory cell and an absence of the threshold amount of the charge carriers to represent a second logic state of the memory cell; and
an optically transmissive region disposed proximate to the array of nanocrystals to allow photons to enter and exit the memory cell, the presence and the absence of the threshold amount of charge carriers determinable via directing a first beam of photons through the optically transmissive region onto the array of nanocrystals and sensing an optical response.

20. The system of claim 19 wherein the array of nanocrystals is insulated by a floating gate insulator of a field effect transistor.

21. The system of claim 19 wherein the optical communication channel comprises an optical data bus.

22. The system of claim 19 wherein the memory cell is optically written to by directing a second beam of photons onto the array of nanocrystals to cause the charge carriers to escape from the array of nanocrystals.

23. The system of claim 19 wherein the memory cell can be electrically written to and read from.

24. A method of reading a memory device, comprising:
directing a beam of first photons onto an array of insulated nanocrystals formed proximate to a substrate; and
sensing an optical response to the beam of the first photons from the array of insulated nanocrystals to determine whether the memory device is in one of a first logic state or a second logic state,
wherein the first photons have an energetic level less than a band gap energy between a valence band and a conduction band of the insulated nanocrystals and wherein the optical response includes absorption of the first photons by the insulated nanocrystals, an absence of a threshold amount of absorption indicating that the memory device is in the first logic state, a presence of at least the threshold amount of absorption indicating that the memory device is in the second logic state.

25. The method of claim 24 wherein the array of insulated nanocrystals is embedded within a floating gate insulating layer of a transistor formed on a semiconductor substrate.

26. A method of claim 25 wherein the beam of first photons is directed through a transparent region of an electrically conductive contact formed on the floating gate insulating layer.

27. The method of claim 24, further comprising measuring a threshold voltage of the transistor to electrically determine whether the memory device is in one of the first logic state or the second logic state.

* * * * *